(12) United States Patent
Dutta et al.

(10) Patent No.: US 11,119,042 B2
(45) Date of Patent: Sep. 14, 2021

(54) ALL-OPTICAL WRITE/READ SCHEME FOR MAGNETIC NANOSTRUCTURES

(71) Applicant: Purdue Research Foundation, West Lafayette, IN (US)

(72) Inventors: Aveek Dutta, West Lafayette, IN (US); Vladimir M. Shalaev, West Lafayette, IN (US); Alexandra Boltasseva, West Lafayette, IN (US); Esteban E. Marinero-Caceres, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 16/990,754

(22) Filed: Aug. 11, 2020

(65) Prior Publication Data
US 2020/0371026 A1  Nov. 26, 2020

Related U.S. Application Data

(63) Continuation of application No. 16/399,917, filed on Apr. 30, 2019, now Pat. No. 10,739,261.
(Continued)

(51) Int. Cl.
*G01N 21/552*   (2014.01)
*G01N 21/01*    (2006.01)
(Continued)

(52) U.S. Cl.
CPC ............ *G01N 21/553* (2013.01); *G01N 21/01* (2013.01); *G01R 33/1215* (2013.01); *B82Y 20/00* (2013.01);
(Continued)

(58) Field of Classification Search
CPC ........ G01N 2021/0162; G01N 21/553; G01N 21/01; B82Y 20/00; B82Y 35/00;
(Continued)

(56) References Cited

U.S. PATENT DOCUMENTS 7,760,053 B2 * 7/2010 Kochergin ............. G02B 1/007
                                                 333/208
9,105,832 B2 * 8/2015 Buhrman ............ G11C 11/1673
(Continued)

*Primary Examiner* — Hoa Q Pham
(74) *Attorney, Agent, or Firm* — Piroozi-IP, LLC

(57) ABSTRACT

A system of writing to and reading from a magnetic nanostructure is disclosed which includes an opto-magnetic write arrangement including a polarizer configured to receive incident light and provide a circularly or linearly polarized light, wherein light polarization is controlled by the polarizer and its orientation with respect to polarization of the incident light, a nanomagnetic structure configured to receive the polarized light including a substrate, and a nanomagnetic stack including a nanomagnet, and a capping layer, wherein the nanomagnetic stack is configured to receive the polarized light and thereby switch orientation of a magnetic moment associated with the magnetic nanostructure whereby the magnetic moment direction specifies a bit value held in the magnetic structure, and a magnetic read arrangement, configured to receive and interpret an optical signal from the magnetic nanostructure indicating the magnetic moment orientation from the nanomagnetic stack.

8 Claims, 18 Drawing Sheets

Related U.S. Application Data

(60) Provisional application No. 62/664,925, filed on Apr. 30, 2018.

(51) Int. Cl.
*G01R 33/12* (2006.01)
*B82Y 20/00* (2011.01)
*B82Y 35/00* (2011.01)

(52) U.S. Cl.
CPC ...... *B82Y 35/00* (2013.01); *G01N 2021/0162* (2013.01)

(58) Field of Classification Search
CPC ... G01R 33/1215; H01F 10/123; H01L 43/08; H01L 43/10; H01L 43/12; H01L 27/222
USPC .................................. 356/445–448, 364–369
See application file for complete search history.

(56) References Cited

U.S. PATENT DOCUMENTS

| | | | |
|---|---|---|---|
| 10,739,261 B2* | 8/2020 | Dutta | G01N 21/01 |
| 2012/0280336 A1* | 11/2012 | Jan | H01L 43/12 |
| | | | 257/421 |
| 2013/0121068 A1* | 5/2013 | Ruotolo | G11C 11/1693 |
| | | | 365/158 |
| 2015/0177239 A1* | 6/2015 | Evers | G01N 33/54366 |
| | | | 435/6.1 |
| 2017/0279038 A1* | 9/2017 | Wu | H01L 43/10 |
| 2018/0003865 A1* | 1/2018 | Guler | B01J 27/24 |
| 2019/0353830 A1* | 11/2019 | Kildishev | G11B 7/1381 |
| 2020/0048084 A1* | 2/2020 | Acosta | G01R 33/12 |
| 2021/0103011 A1* | 4/2021 | Noh | H01L 43/12 |

\* cited by examiner

ALL-OPTICAL WRITE/READ SCHEME FOR MAGNETIC NANOSTRUCTURES

CROSS-REFERENCE TO RELATED APPLICATIONS

The present patent application is related to and claims the priority benefit of U.S. Non-Provisional patent application Ser. No. 16/399,917 filed Apr. 30, 2019 titled "SURFACE-PLASMON OPTO-MAGNETIC FIELD ENHANCEMENT FOR ALL-OPTICAL MAGNETIZATION SWITCHING" now U.S. Pat. No. 10,739,261 to Dutta et al., and U.S. Provisional Patent Application Ser. No. 62/664,925 filed Apr. 30, 2018, titled "Surface-plasmon opto-magnetic field enhancement for all-optical magnetization switching" the contents of each of which are hereby incorporated by reference in their entirety into the present disclosure.

STATEMENT REGARDING GOVERNMENT FUNDING

This invention was made with government support under N00014-16-1-3003 awarded by the Office of Naval Research. The government has certain rights in the invention.

TECHNICAL FIELD

The present disclosure generally relates to optomagnetic devices, and in particular, to optomagnetic devices with nanostructures.

BACKGROUND

This section introduces aspects that may help facilitate a better understanding of the disclosure. Accordingly, these statements are to be read in this light and are not to be understood as admissions about what is or is not prior art.

The demand for faster devices operating in ps or fs regimes is now here corresponding with Moore's law. Consequently, at these speeds the need for lower energy devices is critical. Thus, spintronics is now becoming a choice technology for a variety of different applications including memory and logic. The magnetic tunnel junction is now the most ubiquitous spintronic memory device in which the magnetization of the storage layer is switched by spin-transfer-torque or spin-orbit torque interactions. Whereas these novel spin-torque interactions exemplify the potential of electron-spin-based devices and memory, the switching speed is limited to the ns regime because of the precessional motion of the magnetization. In particular, state of the art spin-transfer-torque magnetic tunnel junctions (STT-MTJ) require high current densities of the order of $10^7$-$10^8$ A/cm$^2$, making them unattractive from an energy consumption perspective for high frequency applications of ps or fs magnetization switching. In addition such high current densities can result in electrical breakdown of the MgO tunnel barrier, negatively impacting their reliability.

An all-optical magnetization switching, largely based on the inverse Faraday effect, has been shown to be an attractive method for achieving magnetization switching at ps speeds. While these devices have been shown to operate at the desired switching speeds, they are not compatible with semiconductor manufacturing processing.

Therefore, there is an unmet need for a novel optical switching mechanism that can work with semiconductor-based ultra-high density integrated nanostructure fabrication.

SUMMARY

A system of writing to and reading from a magnetic nanostructure is disclosed. The system includes an opto-magnetic write arrangement. The arrangement includes a polarizer configured to receive incident light and provide a circularly or linearly polarized light. Light polarization is controlled by the polarizer and its orientation with respect to polarization of the incident light. The system also includes a nanomagnetic structure configured to receive the polarized light. The nanomagnetic structure a substrate, and a nanomagnetic stack. The nanomagnetic stack includes a nanomagnet, and a capping layer. The nanomagnetic stack is configured to receive the polarized light and thereby switch orientation of a magnetic moment associated with the magnetic nanostructure whereby the magnetic moment direction specifies a bit value held in the magnetic structure. The system further includes a magnetic read arrangement, configured to receive and interpret an optical signal from the magnetic nanostructure indicating the magnetic moment orientation from the nanomagnetic stack.

DETAILED DESCRIPTION

Figure 1:
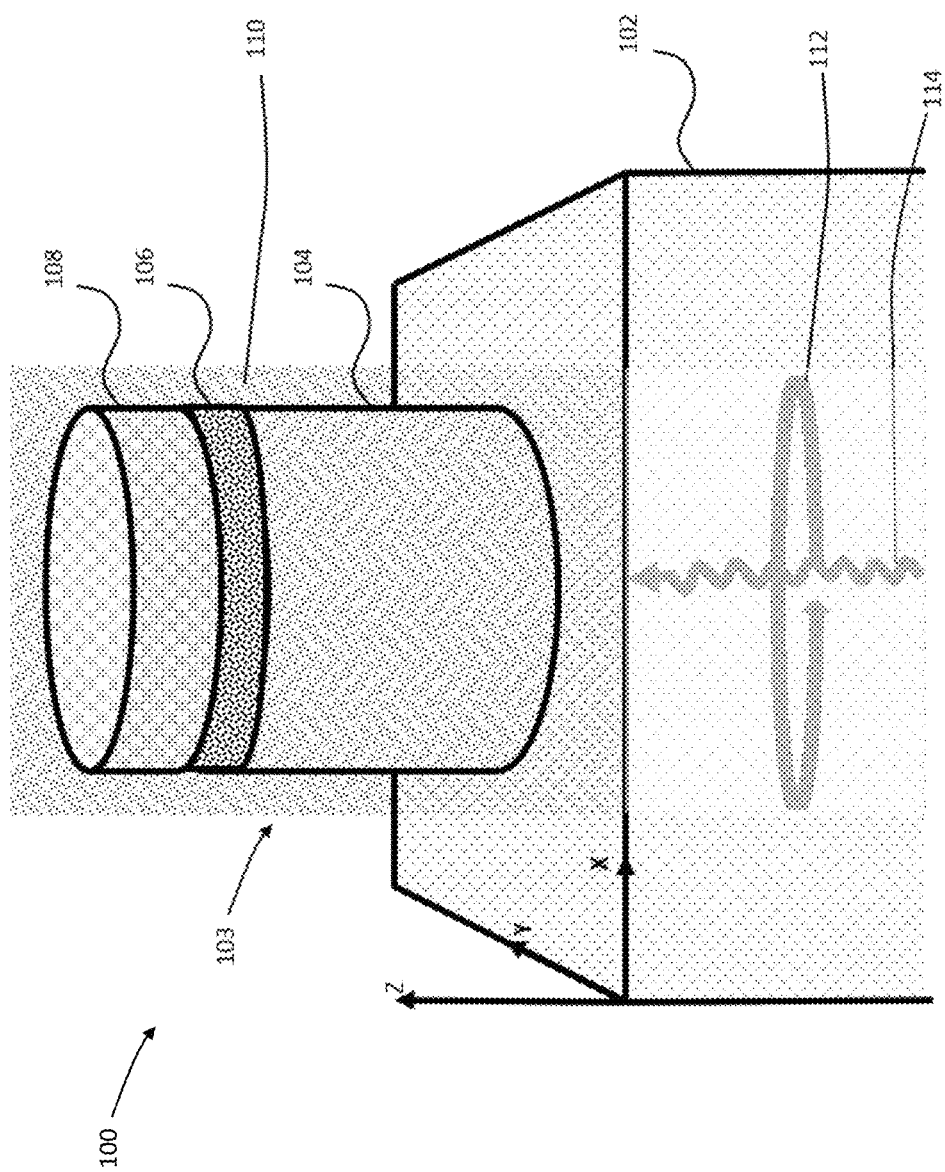
FIG. 1 is a schematic diagram of a coupled magneto-plasmonic nanostructure with a magneto-plasmonic stack including a nano-sized plasmonic resonator coupled to a nanomagnet, according to the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

Optical-only magnetization switching has been shown in recent years to overcome the aforementioned ns regime precession dynamics limits. Thus, 40-fs circularly polarized laser pulses have been employed to reversibly switch the magnetization by changing the light helicity in a wide range of magnetic materials. Circularly polarized laser pulses provide an effective magnetic field via the inverse Faraday effect. This opto-magnetic field is proportional to [E(ω)×E*(ω)] where (E is the light electric field). This opto-magnetic field, $H_{OM}$, is largely responsible for the ultrafast magnetization reversal. The magnitude of this field depends on the intensity of the incident light as given by the following equation:

$$H_{OM} = \beta \varepsilon_0 (E(\omega) \times E^*(\omega)) \qquad (1)$$

where β is the magneto-optical susceptibility of the magnetic material,
$\varepsilon_0$ is the permittivity of free space, and
E is the magnitude of electric-field of the electromagnetic wave inside the magnetic material.

The magneto-optical susceptibility is calculated using the following equation:

$$\beta = \frac{\theta_F \lambda n}{A = \pi d M_0} \qquad (2)$$

where $\theta_F$ is the Faraday rotation at wavelength λ for a magnetic material layer with magnetization $M_0$ and real part of refractive index n. Using the above relationships, in the present disclosure, the effect on the opto-magnetic field of surface plasmons generated with circularly polarized light at the interface between magnetic materials and plasmon resonators is used to generate a novel on-chip integration of nanoscale photonic and magnetic devices. The magnitude of the plasmon-generated opto-magnetic field, $H_{OM}$, is enhanced by about 10 times in comparison to that resulting from the direct photon-magnetic material coupling. In particular, this enhancement is observed when the magnetic material is behaves as a dielectric rather than metallic at optical frequencies rather than a conventional metallic thin film.

Plasmonics is a phenomenon utilized in the novel structure of the present disclosure. Plasmonics deals with the study of the oscillations of free electrons in a metal coupled to an electromagnetic field. In particular Surface plasmon polaritons (SPPs) are infrared or visible-frequency electromagnetic waves that travel along a metal-dielectric or metal-air interface. They are a type of surface wave, guided along the interface in much the same way that light can be guided by an optical fiber. SPPs are shorter in wavelength than the incident light. Hence, SPPs can have tighter spatial confinement and higher local field intensity. Therefore, plasmonics enables the localization of electromagnetic energy to dimensions much smaller than the diffraction limit of light. This phenomenon was advantageously utilized to generate plasmonic resonators coupled to nanomagnet structures to provide the novel structure of the present disclosure. As a result opto-magnetic fields are generated under illumination with circularly polarized light. In particular, under identical laser fluences, significantly larger opto-magnetic fields are generated in the coupled plasmonic/magnetic nanostructures when compared to direct light excitation of the nanomagnet. Therefore, with the larger opto-magnetic fields obtained for the same input intensity of light being acted upon the nano-magnets the high desired switching can be realized with all the benefits of high efficiency, low-energy opto-magnetic switching of the prior art which could not have been implemented in nano-structures. Earlier, magnetic tunnel junctions (referred to above) used magnetic materials with in-plane magnetic anisotropy. However, it has been shown that layers with perpendicular magnetic anisotropy can lower the necessary write current density. In the present disclosure, perpendicular magnetic anisotropy (PMA) and the associated magnetic materials and structures are used in the switching of nanomagnets. Therefore, discussion in the present disclosure pertains mainly to the z-component of the opto-magnetic field generated by surface plasmons. However, the teachings of the present disclosure are readily applicable to in-plane magnets. Additionally, it should be appreciated that these teachings also apply to switching magnets engineered to exhibit tilted magnetization orientation.

Referring to FIG. 1 a schematic diagram of a coupled magneto-plasmonic structure 100, according to the present disclosure, is provided. The magneto-plasmonic structure 100 includes a substrate 102 (shown in a cubical form for demonstration purposes, however, the substrate 102 can be in any form appropriate for the implementation of the magneto-plasmonic structure 100 in a high-speed switching system). The substrate is an optically transparent dielectric layer, e.g., magnesium oxide, sapphire, or other suitable dielectrics known to a person having ordinary skill in the art. The magneto-plasmonic structure 100 also includes a magneto-plasmonic stack 103 comprising a plasmonic resonator 104, a nanomagnet 106, and a capping layer 108. In FIG. 1, light 110 is shone from below. The circular arrow 112 depicts illumination which is circularly polarized light and the curly arrow 114 indicates the direction of incidence of the light 110. Circularly polarized light, as known to a person having ordinary skill in the art, refers to an electromagnetic wave in which, at each point, the electric field of the wave has a constant magnitude but its direction rotates with time at a steady rate in a plane perpendicular to the direction of the wave. light with orthogonal electric field components phase shifted by 90°. Such electric fields of electromagnetic waves can be produced from linearly polarized light using a circular polarization filter such as a zero-order quarter waveplate or any other component known to a person of skill in this art that produces circular from linearly polarized electromagnetic fields. To enable compatibility with high-speed complementary metal oxide semiconductor (CMOS) needs, low-loss CMOS compatible refractory metals are utilized instead of gold and silver, i.e., metals which are known to exhibit strong plasmonic activity but are CMOS-incompatible. In this regard, refractory transition metal nitrides have emerged as suitable candidates for the visible and near-infrared (NIR) plasmonic applications. In particular, titanium nitride exhibits optical properties comparable to those of gold, it is compatible with current nanofabrication technologies and can be epitaxially grown on c-sapphire and magnesium oxide (MgO) which all make good substrate choices for the structures of the present disclosure. Therefore, an exemplary choice of material for the plasmonic resonator 104 is titanium nitride (TiN) with the substrate 102 made of MgO. For the thin nanomagnet 106, exemplary choices for the magnetic PMA materials include Bi-substituted iron garnet (BIG) and Gadolinium Iron Cobalt (GdFeCo), however, other nanomagnets, known to a person having ordinary skill in the art can also be used.

For the capping layer 108 $Si_3N_4$ was used as an exemplary material. The following dimensional ranges are provided for the magneto-plasmonic structure 100, according to the present disclosure, however, it should be understood that other dimensions can be used for specific application, and therefore no limitation is intended by the use of these dimensions. The magneto-plasmonic stack 103 has a diameter between about 10 nm and about 100 nm with the plasmonic resonator 104 having a thickness of about 10 nm to about 50 nm and the capping layer 108 having a thickness of about 10 nm to about 40 nm. The thickness of the nanomagnet 106 was held at about 10 nm for both types of magnetic materials, BIG and GdFeCo. The effect of increasing/decreasing the diameter of the magneto-plasmonic stack 103 on the magnitude of the opto-magnetic field $H_{OM}$ is further described below. Plasmonic resonances (wavelength, intensity) in these stacks depend on the intrinsic optical properties of the constituent materials and their dimensions. For example for the case of TiN and the magneto-plasmonic stack 103 having a diameter of about 30 nm, it exhibits strong plasmonic activity in the visible and NIR. The choice of $Si_3N_4$ as the material for the capping layer 108 and its thickness (about 10 nm to about 40 nm) allows plasmonic excitations in the visible/NIR wavelength region of interest. Normal incidence illumination by circularly polarized light through the substrate 102 is arranged, as shown in FIG. 1 and denoted by the circular arrow 112 and the curly arrow 114. While the incident light is shone from below and through the substrate 102, it should be appreciated that incidence from above the substrate would also provide similar results to those outlined in the present disclosure. The excitation wavelength is chosen to match the TiN nanodisk plasmonic resonance. This is determined to be about 710 nm for the material dimensions and optical constants employed, however, other wavelengths would be appropriate for other material selection and dimensions. The illumination intensity is chosen as about 1 $mJ/cm^2$.

Figure 2:
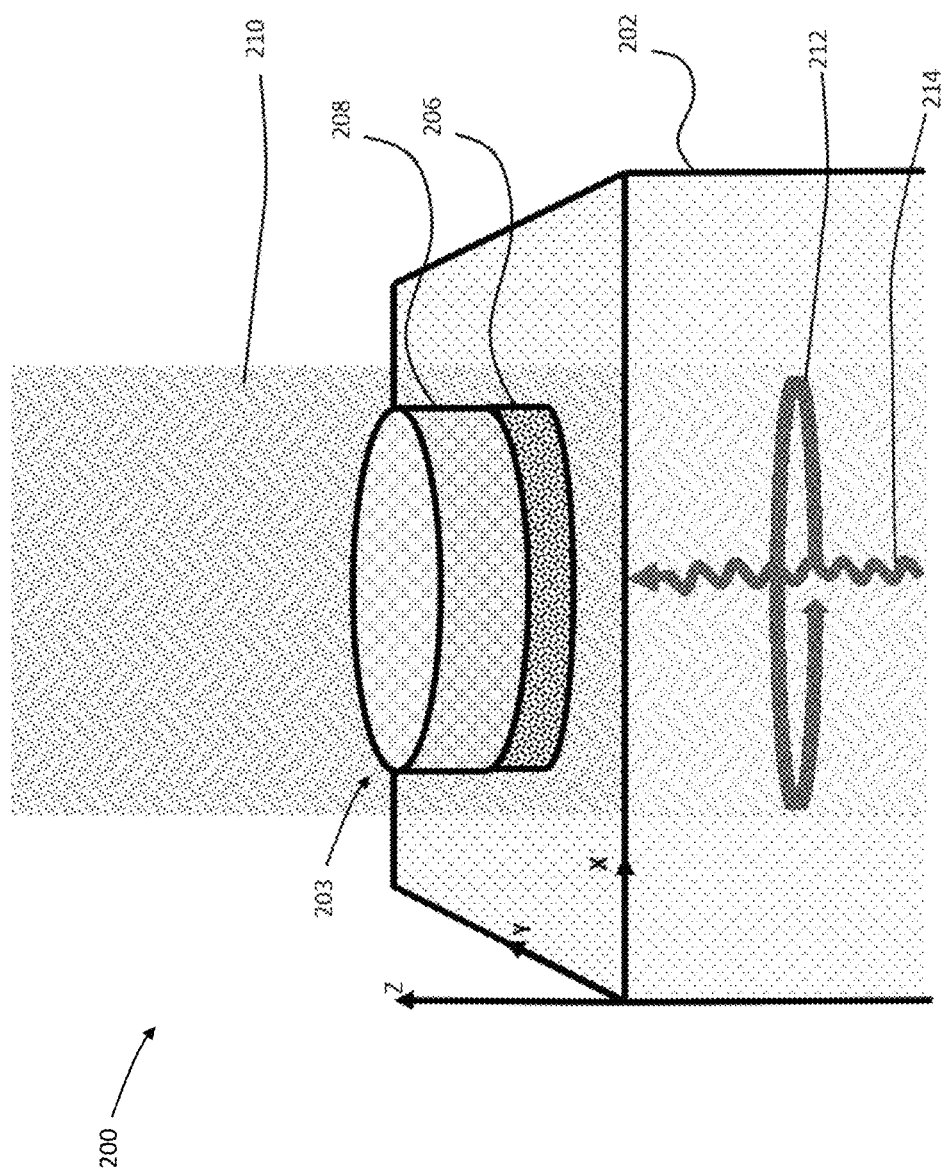
FIG. 2 is a schematic diagram of a coupled nanomagnetic structure including a substrate and a nanomagnet but without the nanosized plasmonic resonator provided for comparison to the magneto-plasmonic structure shown in FIG. 1.

Referring to FIG. 2, a schematic diagram of a coupled nanomagnetic structure 200 is also provided, for comparison to the magneto-plasmonic structure 100 shown in FIG. 1. Similarly, the nanomagnetic structure 200 includes a substrate 202. The substrate is an optically transparent dielectric layer, e.g., magnesium oxide or other suitable dielectrics known to a person having ordinary skill in the art. The nanomagnetic structure 200 also includes a non-plasmonic stack 203 (as compared to the magneto-plasmonic stack 103) comprising a nanomagnet 206, and a capping layer 208. In FIG. 2, light 210 is shone from below. The circular arrow 212 depicts illumination which is circularly polarized light and the curly arrow 214 indicates the direction of incidence of the light 210.

As will be discussed below, almost an order of magnitude increase in the magnitude of the opto-magnetic field when the interaction with the nanomagnet is via the magneto-plasmonic stack 103 and in particular with the plasmonic resonator 104 (see FIG. 1) as compared to the non-plasmonic stack 203 (see FIG. 2). This significant increment is attributed to the near-field enhancement induced by the plasmonic resonator 104 (see FIG. 1) exhibiting surface plasmon resonances (LSPR), as is known to a person having ordinary skill in the art. This enhancement indicates efficient coupling of electromagnetic radiation with the magneto-plasmonic structure 100 as compared to direct illumination of nanomagnets as it is done in experiments reported thus far on optical-only magnetization switching.

Figure 3:
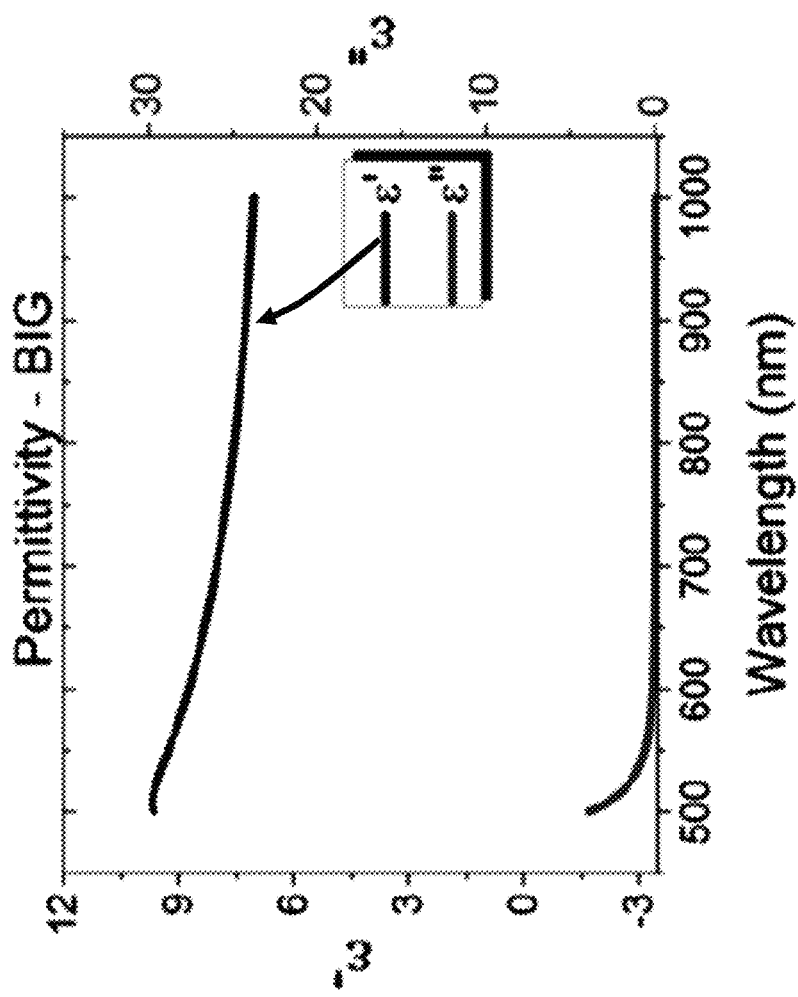
FIG. 3 is a graph of permittivity (real part, $\varepsilon'$, on the left and imaginary part, $\varepsilon''$, on the right: $\tilde{\varepsilon}=\varepsilon'(\omega)+\varepsilon''(\omega)$) for Bi-substituted iron garnet (BIG) used as the material for the nanomagnet of FIG. 1.
Figure 4:
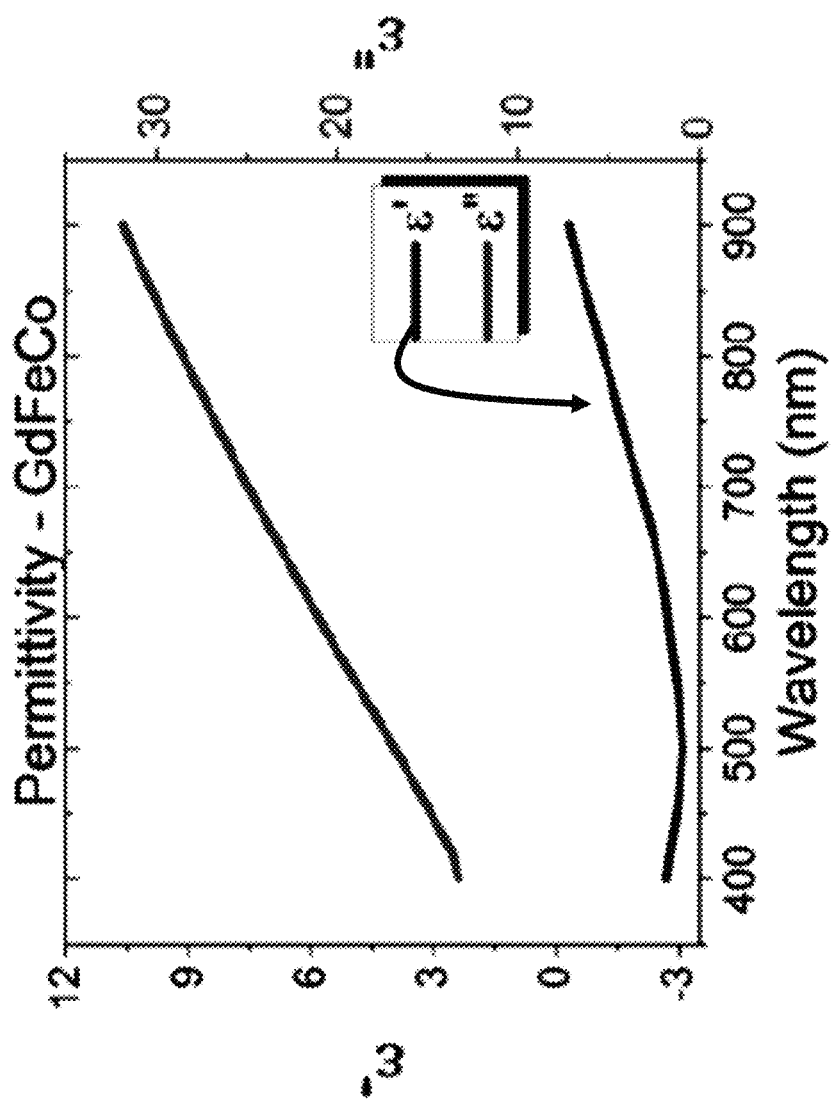
FIG. 4 is a graph of permittivity (real part, $\varepsilon''$, on the left and imaginary part, $\varepsilon''$, on the right: $\tilde{\varepsilon}=\varepsilon'(\omega)+\varepsilon''(\omega)$) for Gadolinium Iron Cobalt (GdFeCo) used as the material for the nanomagnet of FIG. 1.
Figure 5:
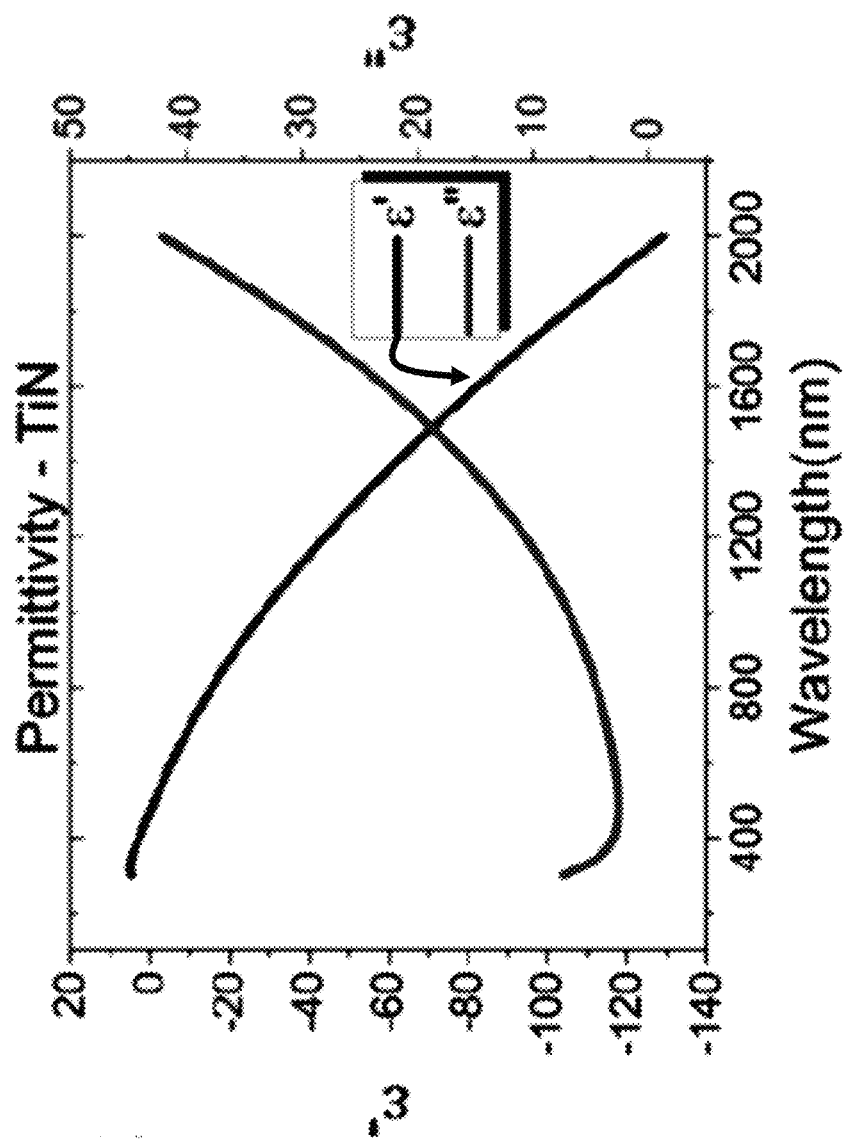
FIG. 5 is a graph of permittivity (real part, $\varepsilon'$, on the left and imaginary part, $\varepsilon''$, on the right: $\tilde{\varepsilon}=\varepsilon'(\omega)+\varepsilon''(\omega)$) for Titanium Nitride (TiN) used as the material for the nano-sized plasmonic resonator of FIG. 1.

Referring back to FIGS. 1 and 2, the material of the thin nanomagnets 106 and 206, were exemplarily provided as BIG and GdFeCo. Referring to FIGS. 3 and 4, graphs of permittivity (real part, ε', on the left and imaginary part, ε", on the right: $\hat{\varepsilon}=\varepsilon'(\omega)+\varepsilon''(\omega)$) are provided for BIG and GdFeCo which show the optical properties of BIG and GdFeCo in the visible and near-infrared regions. Referring to FIG. 5, graphs of permittivity (real part, ε', on the left and imaginary part, ε", on the right: $\hat{\varepsilon}=\varepsilon'(\omega)+\varepsilon''(\omega)$) are provided for TiN which show the optical properties of plasmonic TiN derived from spectroscopic ellipsometry measurements of sputter-deposited 30 nm thick TiN thin films on MgO. Comparison of FIGS. 4 and 5 indicate that at 710 nm, BIG behaves as a lossless dielectric (ε" is zero) whereas GdFeCo is a lossy metal. This results in plasmonic resonances in the magneto-plasmonic structure 100 (see FIG. 1) sample at the plasmonic resonator 104-nanomagnet 106 interface when the material choice is TiN-BIG, in contrast to when the material choice is TiN—GdFeCo. While both GdFeCo and TiN are metallic in nature, the former being a relatively weaker metal (lower value of negative ε'). In this case we observe weak plasmonic resonances at the nanomagnet 106 and capping layer 108 interface (i.e., the GdFeCo—Si$_3$N$_4$ interface).

Figure 6A:
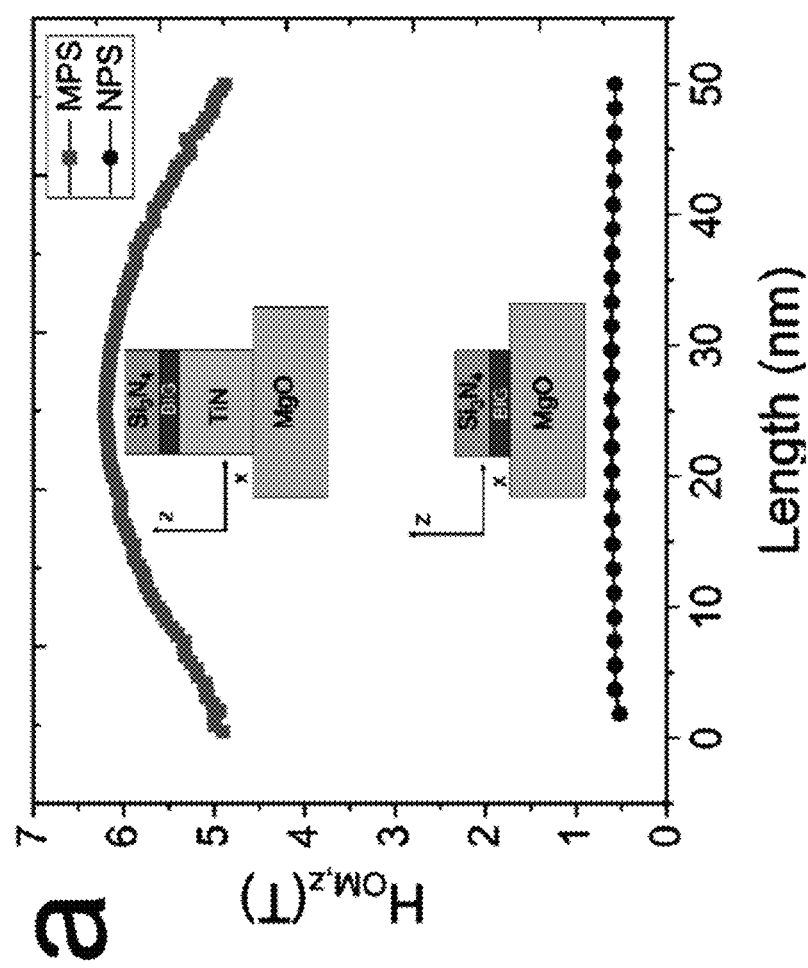
FIG. 6a is the z-component of the opto-magnetic field intensity in units of Tesla (T) vs. length in nm along the diameter of BIG-TiN interface in the x-axis for a 10 nm thick BIG layer in the magneto-plasmonic structure of FIG. 1 vs. the nanomagnetic structure of FIG. 2.
Figure 6B:
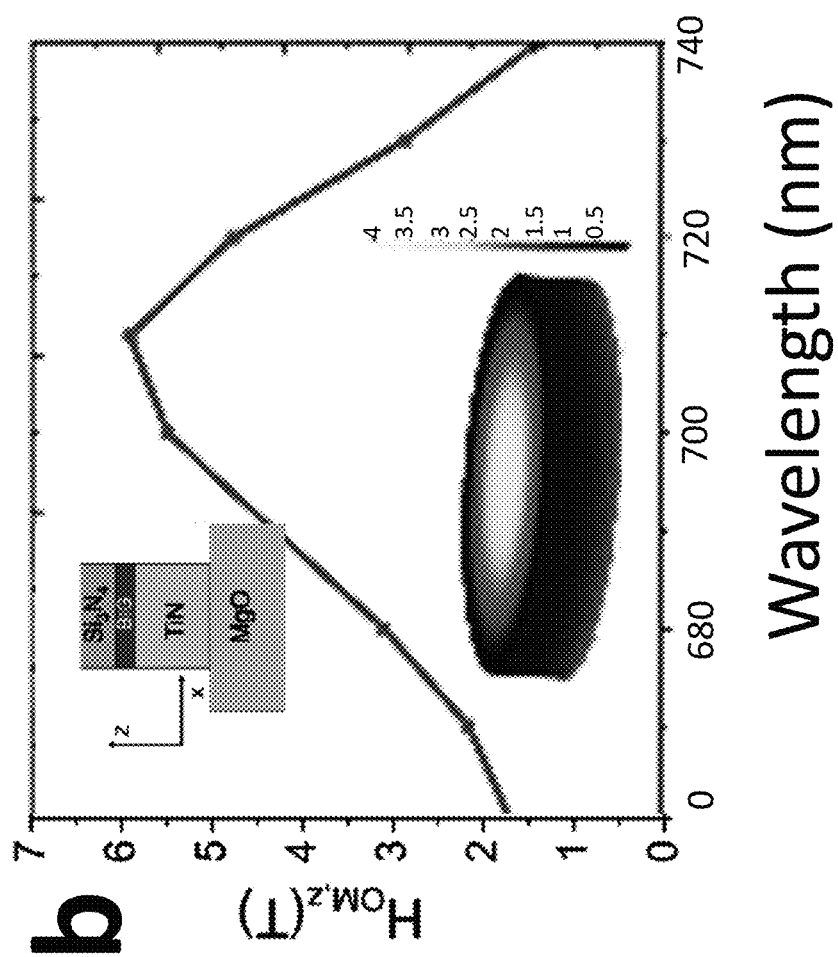
FIG. 6b is a graph showing dependence of the z-component of the opto-magnetic field in T vs wavelength in nm for the magneto-plasmonic structure of FIG. 1 at the center of the magneto-plasmonic stack at the interface of the nano-sized plasmonic resonator and the nanomagnet.

In order to understand the plasmonic resonance, illumination of individual BIG-TiN interface in the magneto-plasmonic structure 100 (see FIG. 1) and the nanomagnet 206 in the non-plasmonic stack 203 (see FIG. 2) were considered separately and the electric field distribution characteristic of the plasmon resonance at 710 nm wavelength were studied. Utilizing Eq. (1), the opto-magnetic field H$_{OM}$ was derived. The magnetic susceptibility β is calculated using Eq. (2) with experimentally reported values θ$_F$ and M$_0$ for BIG. Referring to FIG. 6a, a comparison of the z-component of the opto-magnetic field intensity in T vs. length in nm across the 50 nm diameter of BIG-TiN interface in the x-axis in the magneto-plasmonic structure 100 (see FIG. 1, in FIG. 6a nanomagnet with TiN resonator, upper panel) and the nanomagnetic structure 200 (see FIG. 2, in FIG. 6a only nanomagnet, lower panel) is provided. Illumination is with circularly polarized light of intensity 1 mJ/cm$^2$ at 710 nm wavelength under normal incidence. Note, the plasmonic resonator 104 and the capping layer 108 thicknesses are about 30 nm and about 20 nm respectively. Referring to FIG. 6b a graph of wavelength in nm dependence of the z-component of the opto-magnetic field in T for the magneto-plasmonic structure 100 (see FIG. 1) sample (about 50 nm diameter) at the stack center at the TiN-BIG interface is also provided. It can be clearly seen a 10-fold enhancement in the z-component of the opto-magnetic field in the magneto-plasmonic structure 100 (see FIG. 1) sample compared to the non-plasmonic stack 203 (see FIG. 2) sample. In particular, the parameter H$_{OM,z}$ has a value of about 5.98T for the magneto-plasmonic structure 100 (see FIG. 1) using TiN-BIG vs. about 0.589T for the nanomagnetic structure 200 and its non-plasmonic stack 203 (see FIG. 2) using MgO-BIG. The enhancement in H$_{OM,z}$ due to the plasmon resonance at 710 nm wavelength is also apparent (see FIG. 6b).

Figure 7A:
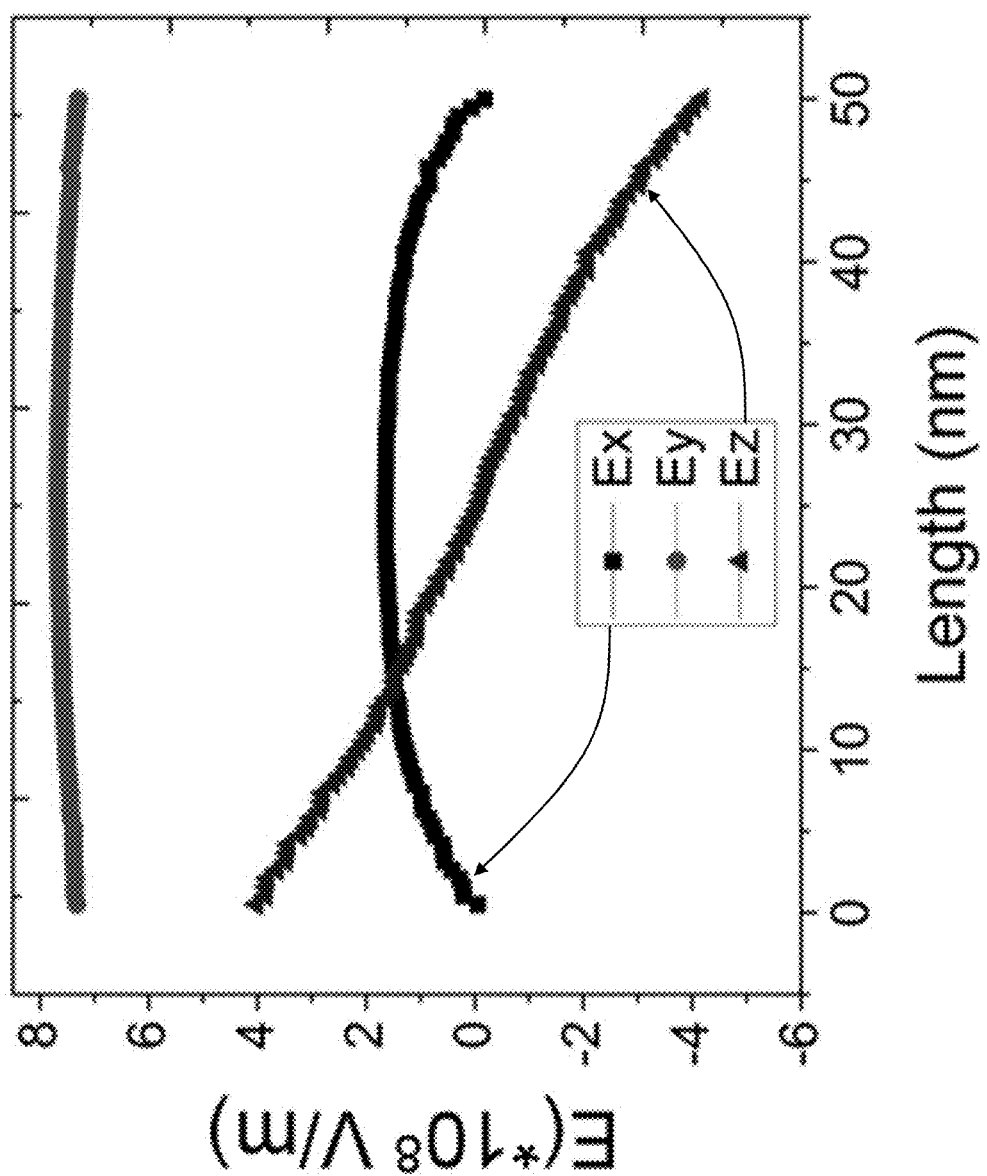
FIG. 7a is a graph of electric field components along the x-axis of the of the nano-sized plasmonic resonator and the nanomagnet interface of the magneto-plasmonic stack of FIG. 1.
Figure 7C:
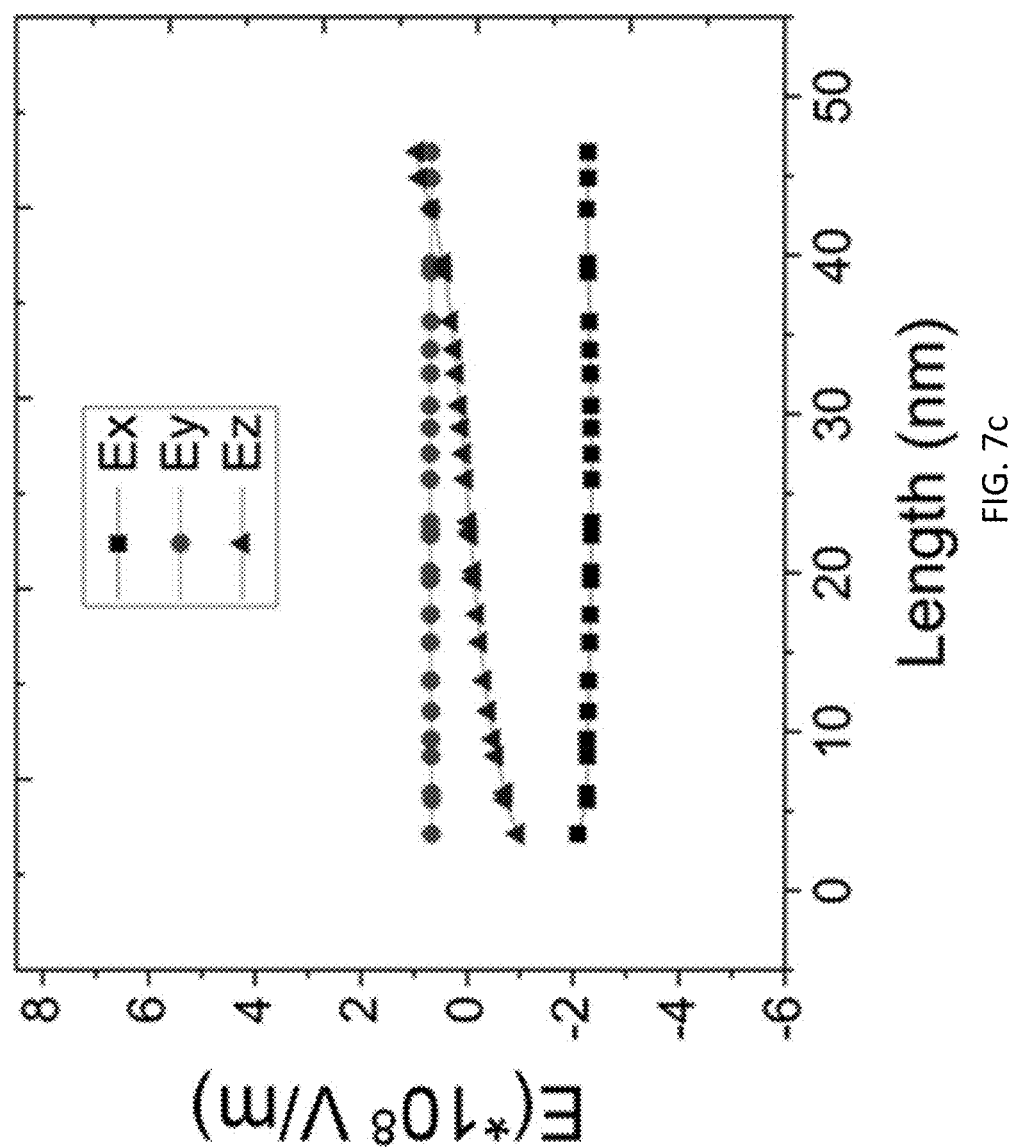
FIG. 7c is a graph of the electric field components along the x-axis of the nanomagnet-substrate interface for the nanomagnetic structure shown in FIG. 2 with BIG as the choice for the nanomagnet.
Figures 7B, 7D:
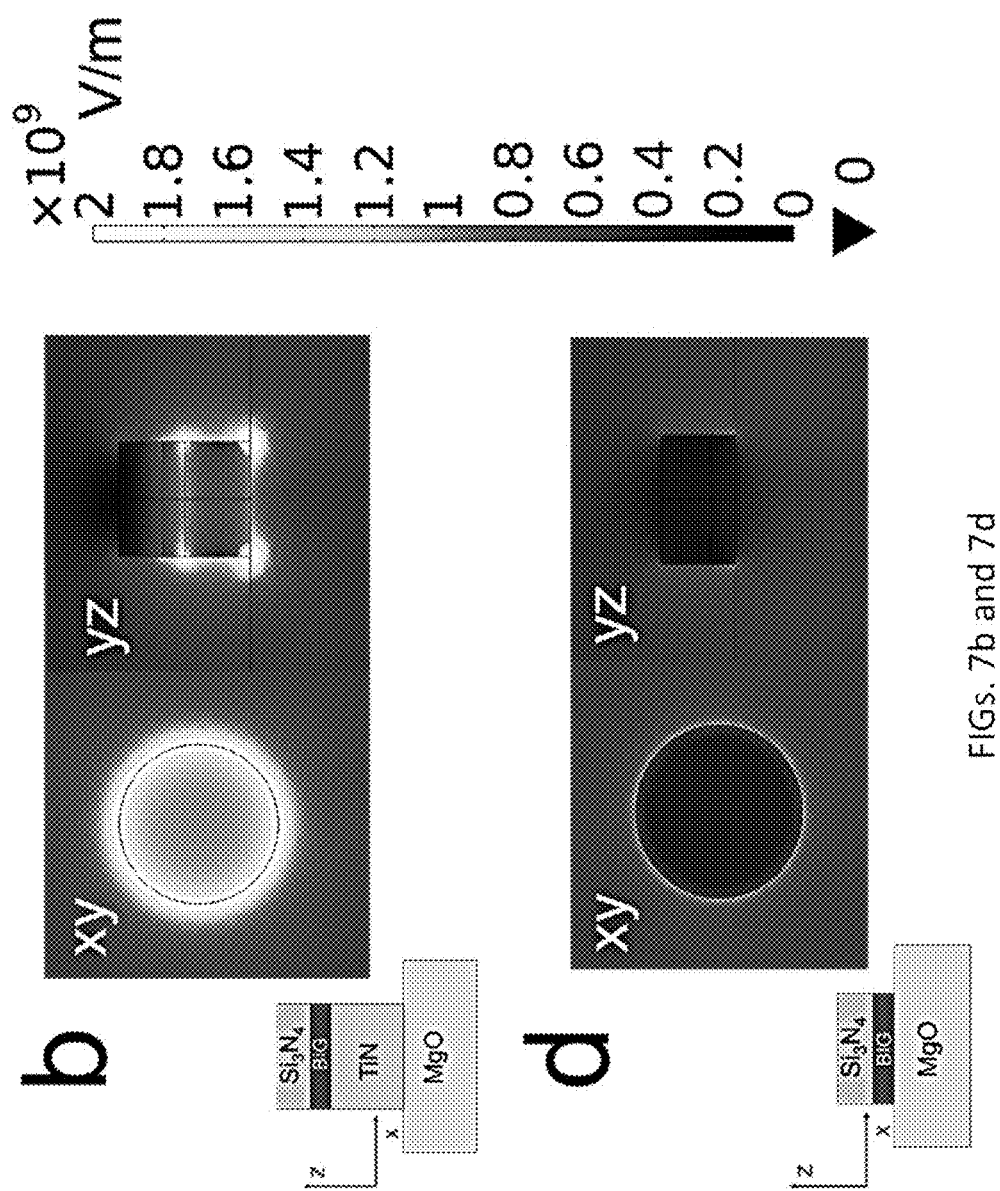
FIG. 7b is an output of the electric field intensity showing a near-field enhancement for the magneto-plasmonic structure of FIG. 1 about the interface of the nano-sized plasmonic resonator and the nanomagnet with BIG as the choice for the nanomagnet in the xy plane.
FIG. 7d is an output of the electric field intensity showing the nonmagnetic structure of FIG. 2 about the interface of the substrate and the nanomagnet with BIG as the choice for the nanomagnet in the xy plane.

Detailed electromagnetic analysis of the BIG in the magneto-plasmonic structure 100 (see FIG. 1) and the nanomagnetic structure 200 when illuminated with circularly polarized light at 710 nm is provided below. When a plasmonic nanodisk is illuminated with circularly polarized light it generates a rotating dipole moment that is associated with the plasmonic resonance. Referring to FIGS. 7a and 7c electric field components along the x-axis of the BIG-TiN interface for the magneto-plasmonic structure 100 (see FIG. 1), shown in FIG. 7a, and the BIG-MgO interface for the nanomagnetic structure 200 (see FIG. 2), shown in FIG. 7c are shown, respectively. Correspondingly, near-field enhancement for the magneto-plasmonic structure 100 (see FIG. 1), shown in FIG. 7b, as compared to the BIG-MgO interface as well as a vertical cross-section of the entire stack (yz plane) for the nanomagnetic structure 200 (see FIG. 2), shown in FIG. 7d are provided where such enhancement is due to the plasmon resonance. Such a field enhancement is responsible for the increase in the opto-magnetic field of the magneto-plasmonic structure 100 (see FIG. 1), as discussed above. A noticeable feature of the plasmon resonance is that it introduces an out-of-plane component of the electric field E$_z$ whereas the incident light has no such z-component. This out-of-plane component of the electric field E$_z$ is a well-known feature of the plasmon resonance. For calculating the opto-magnetic field we have used only the out-of-plane component of the magnetic susceptibility β. Thus, the opto-magnetic field reported in the figures, corresponds only to the z-component of H$_{OM}$. It should be appreciated that due to the presence of additional components of the electric field, plasmon resonances can in principle generate in-plane components of the opto-magnetic field H$_{OM,x/y}$. The amplitudes of these components depend on the magnitude of β in the x,y plane. Such an in-plane component of H$_{OM}$ can lead to more efficient switching of magnets with canted magnetization orientation.

Figure 8A:
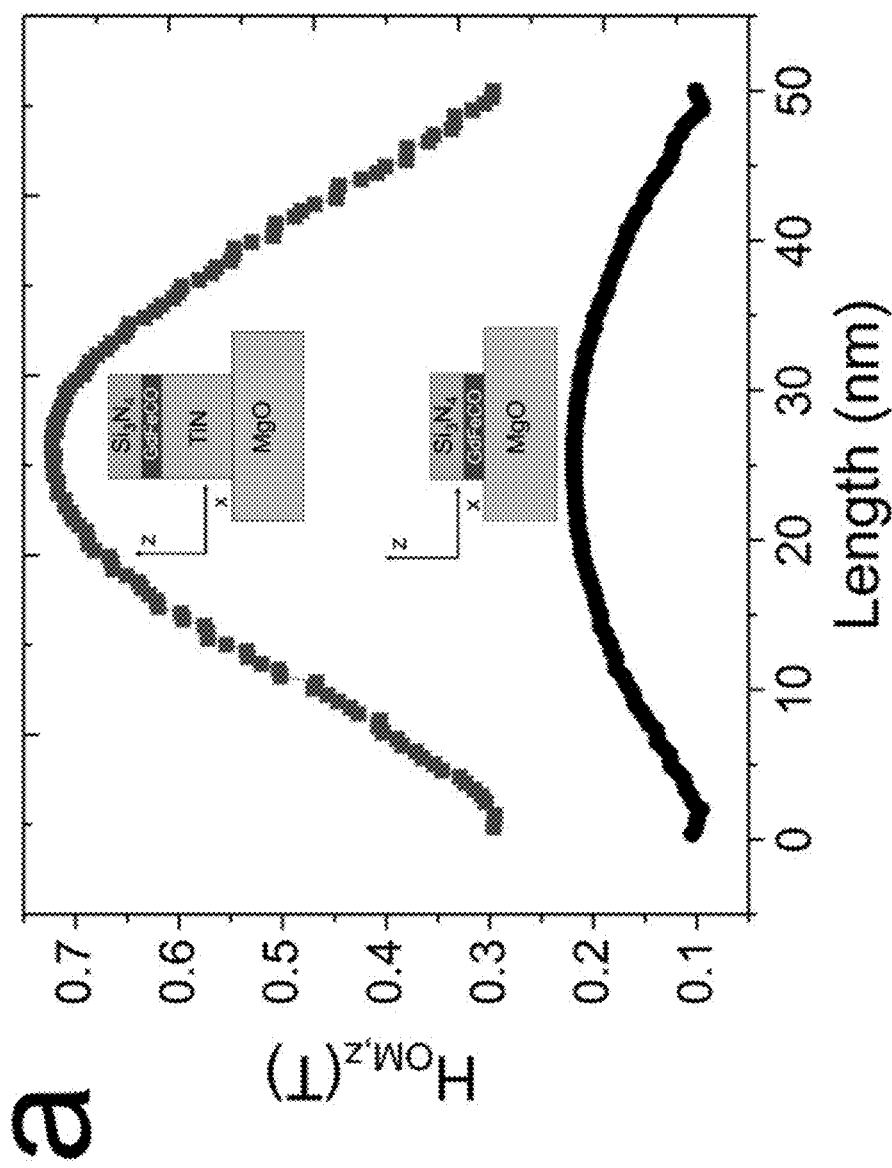
FIG. 8a is a graph of the z-component of opto-magnetic field $H_{OM}$ obtained for the magneto-plasmonic structure of FIG. 1 and the nanomagnetic structure of FIG. 2 with illumination of circularly polarized light at 710 nm wavelength with a 10 nm thick GdFeCo nanomagnet.
Figures 8B, 8C:
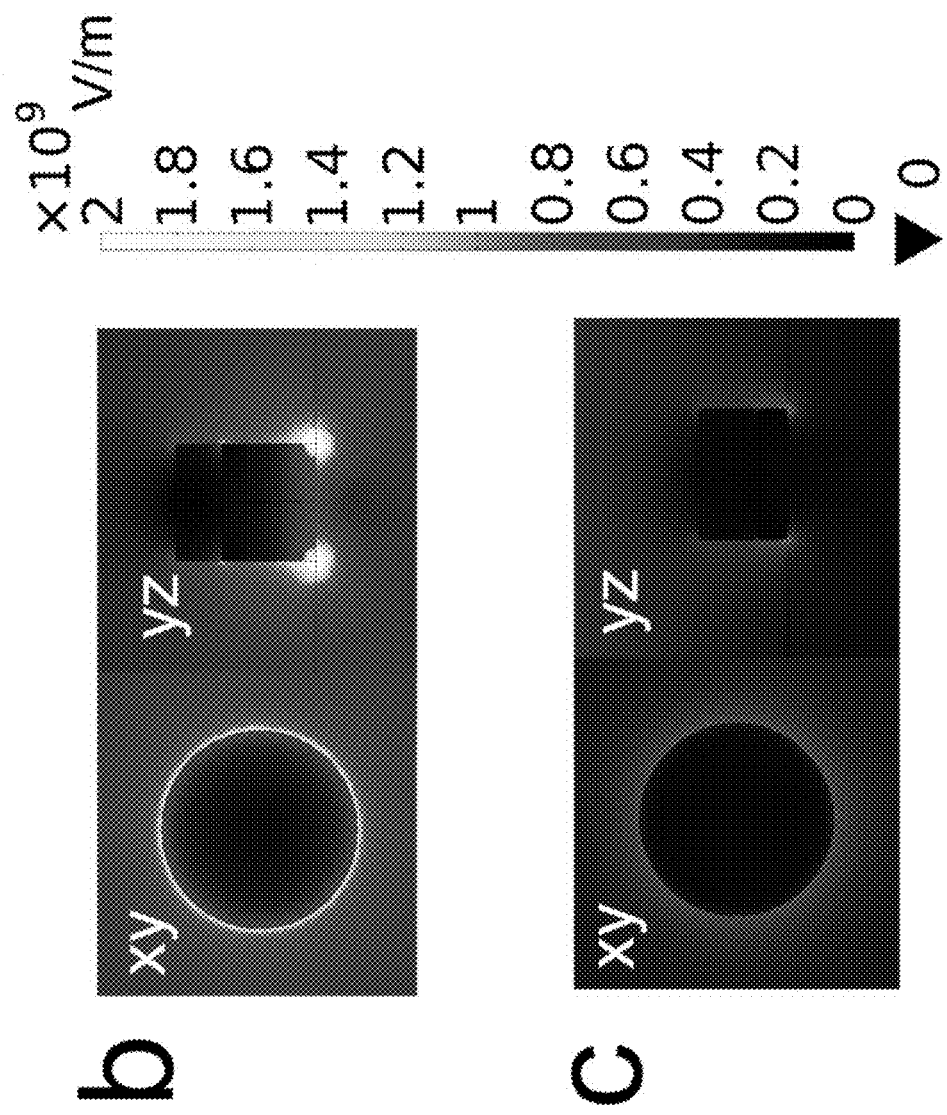
FIG. 8b is an output of the electric field intensity showing a near-field enhancement for the magneto-plasmonic structure of FIG. 1 about the interface of the nano-sized plasmonic resonator and the nanomagnet with GdFeCo as the choice for the nanomagnet in the xy plane.
FIG. 8c is a graph of the electric field components along the x-axis of the nanomagnet-substrate interface for the nanomagnetic structure shown in FIG. 2 with GdFeCo as the choice for the nanomagnet in the xy plane.

Referring to FIG. 8a, the results of the opto-magnetic field H$_{OM}$ obtained for the magneto-plasmonic structure 100 (see FIG. 1) and the nanomagnetic structure 200 (see FIG. 2) samples under illumination of circularly polarized light at 710 nm wavelength are shown when the BIG has been replaced with a 10 nm thick GdFeCo nanomagnet. The magnetic susceptibility is $1.7*10^{-6}$ m/A. As discussed with reference to FIG. 4 above, GdFeCo is metallic in the visible/near-infrared region of the electromagnetic spectrum. Therefore in this case no plasmonic field enhancement at the GdFeCo—TiN interface is observed as both layers are metallic. In contrast, a plasmonic near-field enhancement at the GdFeCo—Si$_3$N$_4$ interface is observed in the magneto-plasmonic structure 100 (see FIG. 1) sample, although this enhancement is weaker. This enhancement is clearly shown in FIGS. 8b and 8c where the electric field intensity for the GdFeCo of the magneto-plasmonic structure 100 (see FIG. 1) sample and the nanomagnetic structure 200 (see FIG. 2) sample are provided, respectively. The reason for the weaker field enhancement is because compared to TiN at 710 nm wavelength, GdFeCo is a more lossy (higher ε") and weaker (lower negative ε') metal. The plasmonic resonance is mostly dominated by GdFeCo, with the TiN contribution to the plasmon resonance being significantly reduced. Hence the magneto-plasmonic structure 100 (see FIG. 1) with GdFeCo does not exhibit large opto-magnetic field enhancement compared to the nonmagnetic structure 200 (see FIG. 2). We note an opto-magnetic field enhancement of only 3.4 in the magneto-plasmonic structure 100 (see FIG. 1) sample compared to the nanomagnetic structure 200 (see FIG. 2) sample which is less than what we observed for BIG due to aforementioned reasons. Although GdFeCo exhibits PMA for thicknesses >10 nm, the use of thicker layers would result in reduction of the contributions of the TiN plasmonic resonator on the opto-magnetic field enhancement. It can be clearly seen a 3-fold enhancement in the z-component of the opto-magnetic field in the magneto-plasmonic structure 100 (see FIG. 1) sample compared to the non-plasmonic stack 203 (see FIG. 2) sample. In particular, the parameter H$_{OM,z}$ has a value of about 0.75T for the magneto-plasmonic structure 100 (see FIG. 1) using TiN—GdFeCo vs. about 0.22T for the nanomagnetic structure 200 and its non-plasmonic stack 203 (see FIG. 2) using MgO—GdFeCo.

Figure 9:
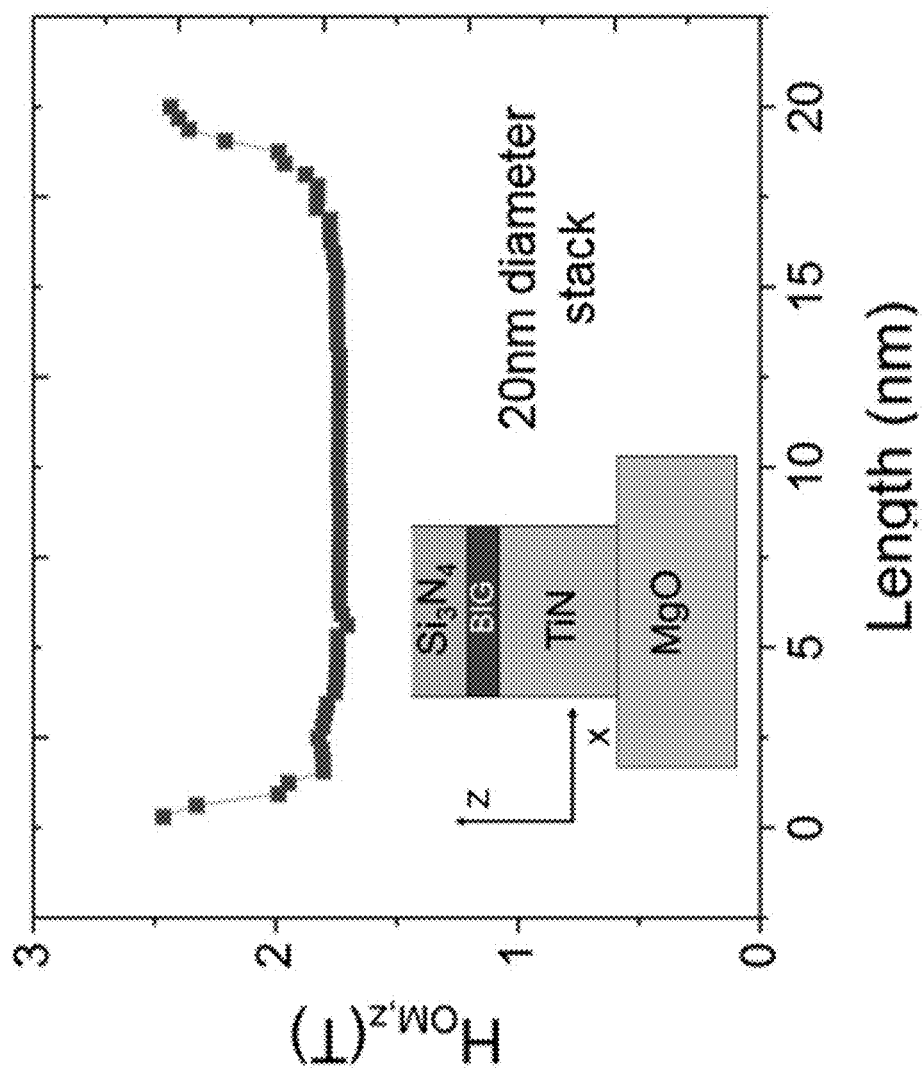
FIG. 9 is a graph of the opto-magnetic field z-component along the x-axis in the xy plane of the interface of the nano-sized plasmonic resonator and the nanomagnet for the structure of the magneto-plasmonic structure of FIG. 1 (BIG-TiN) with 20 nm diameter.
Figure 10:
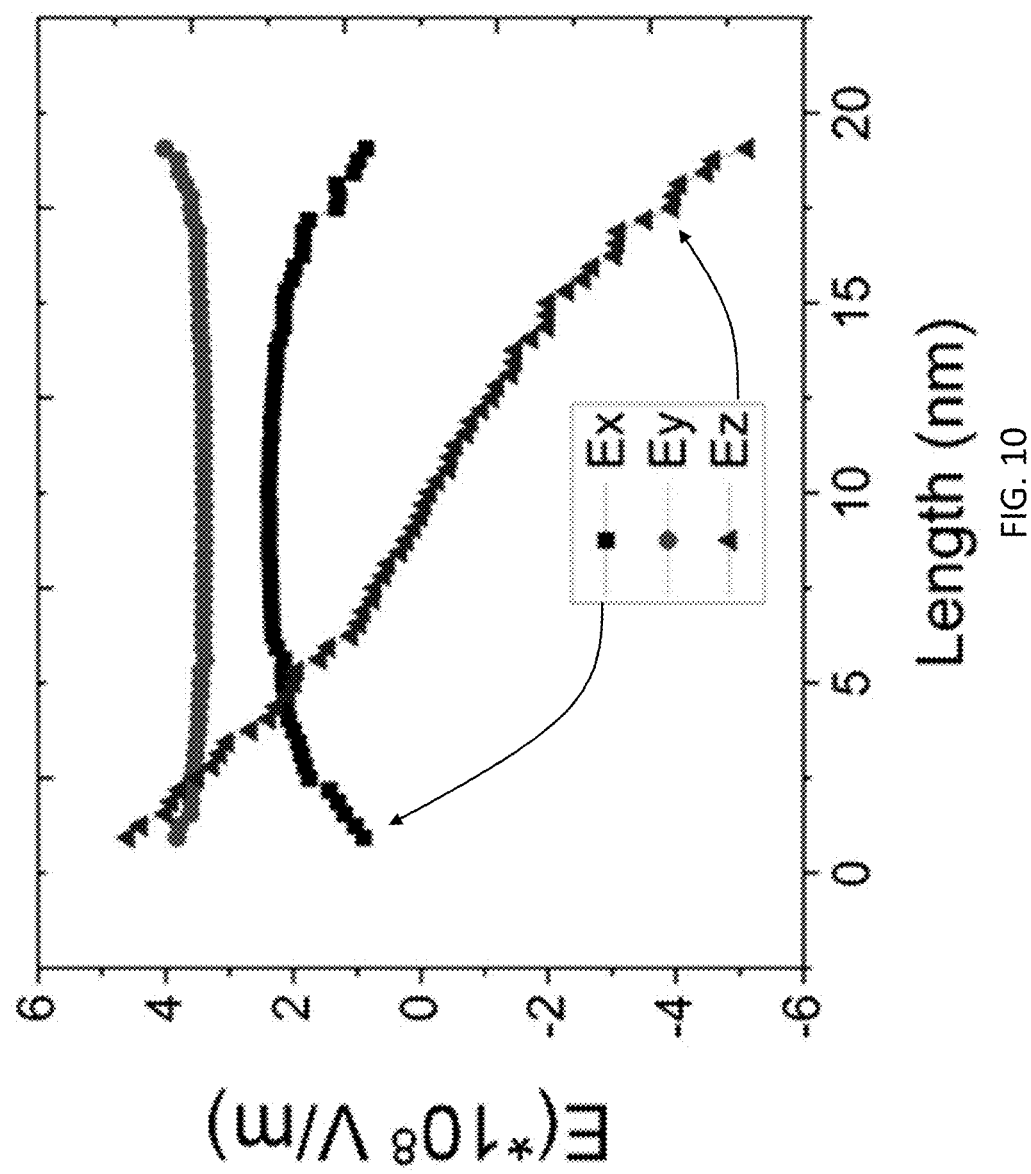
FIG. 10 is a graph of the electric field intensity plot along the diameter in the x-axis plane of the interface of the nano-sized plasmonic resonator and the nanomagnet for the structure of the magneto-plasmonic structure of FIG. 1 (BIG-TiN) shown for a 20 nm diameter.
Figures 11A, 11B:
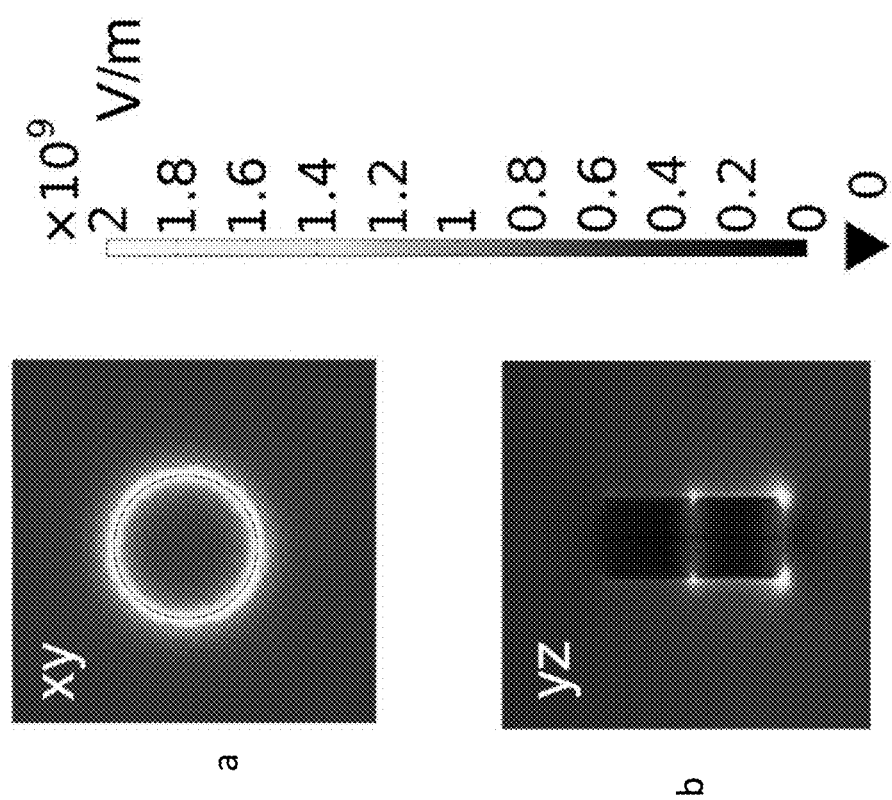
FIG. 11a is an electric field intensity output along the x-axis of the interface of the nano-sized plasmonic resonator and the nanomagnet for the structure of the magneto-plasmonic structure of FIG. 1 (BIG-TiN) shown for a 20 nm diameter.
FIG. 11b is an electric field intensity output along the yz plane of the magneto-plasmonic stack of FIG. 1 (TiN-BIG) perpendicular to the interface of the nano-plasmonic resonator and the nanomagnet shown for a 20 nm diameter.

Next, the dependence of the opto-magnetic field enhancement on the diameter of the magneto-plasmonic stack 103 (see FIG. 1) is discussed. It is well-known that plasmonic resonances in metal nanodisks strongly depend on their size. A change in size can alter the strength of the plasmon resonance. FIG. 9 is a graph of the opto-magnetic field z-component along the x-axis in the xy plane of the BIG-TiN interface for the structure of the magneto-plasmonic structure 100 (see FIG. 1) with 20 nm diameter. A clear enhancement in $H_{OM,Z}$ of about The enhancement in $H_{OM,Z}$ due to the plasmon resonance at 710 nm wavelength is also apparent (see FIG. 6b). However, a comparison of FIG. 6a and FIG. 9 indicate that a reduction of the stack diameter of the magneto-plasmonic structure 100 (see FIG. 1) sample reduces the plasmonic enhancement in $H_{OM}$ from about 10-fold to about 4-fold. Also the nature of the opto-magnetic field along the diameter is different. This difference is due to the weaker nature of the plasmon resonance for the sample with reduced diameter. Referring to FIG. 10 a graph of electric field intensity plot along the yz plane of the magneto-plasmonic stack 103 (see FIG. 1) is shown for a 20 nm diameter. Illumination is with circularly polarized light of intensity 1 mJ/cm$^2$ at 710 nm wavelength. Comparing FIGS. 7a and 10, one can clearly see that the y-component of the electric field is reduced upon reducing the diameter. FIG. 7a corresponds to a 50 nm diameter stack whereas FIG. 10 is for the 20 nm stack. This leads to a reduction in $H_{OM,Z}$. Also the variation of the y-component of the electric field of light along the stack diameter is slightly different upon reducing the diameter of the stack. Consequently there is a change in the way $H_{OM,Z}$ varies along the diameter when the stack diameter is reduced. Nevertheless, the plasmonic enhancement in $H_{OM,Z}$ still persists. This illustrates that plasmon mediated magnetic switching is compatible with dimensionality reduction of nanomagnets for ultra-high density storage and it points to opportunities to increase the effect by matching the excitation light source to the plasmon resonance. Referring to FIGS. 11a and 11b, electric field components along the x-axis of the TiN-BIG interface and electric field intensity plot along the yz plane of the magneto-plasmonic stack 103 with 20 nm diameter (see FIG. 1) are shown, respectively. Again, illumination is with circularly polarized light of intensity 1 mJ/cm$^2$ at 710 nm wavelength.

It should be appreciated that the optical anisotropy of both GdFeCo and BIG magnetic layers were ignored. This is because the off-diagonal terms of the permittivity tensor for both materials, obtained from the product of β and $M_0$ are at least an order of magnitude lower than the diagonal terms as shown in FIGS. 3 and 4.

TABLE 1

Summary of Results

| Magnetic Material | n | $\theta_F$ (deg.) | $M_0$ (A/m) | β (m/A) | FOM |
|---|---|---|---|---|---|
| BIG | 2.9 | 0.027 [25] | 5.5 * 10$^4$ [26] | 5.7 * 10$^{-7}$ | 10 |
| GdFeCo | 3.45 | 0.75 [5] | 1 * 10$^5$ [5] | 1.7 * 10$^{-6}$ [5] | 3.4 | where figure of merit (FOM) is calculated from $$H_{OM} = \frac{H_{OM,z(Plasmonic\ Stack)}}{H_{OM,z(non-plasmonic\ stack)}} \quad (3)$$

where the plasmonic stack is shown in FIG. 1 and non-plasmonic stack is shown in FIG. 2.

Figure 12:
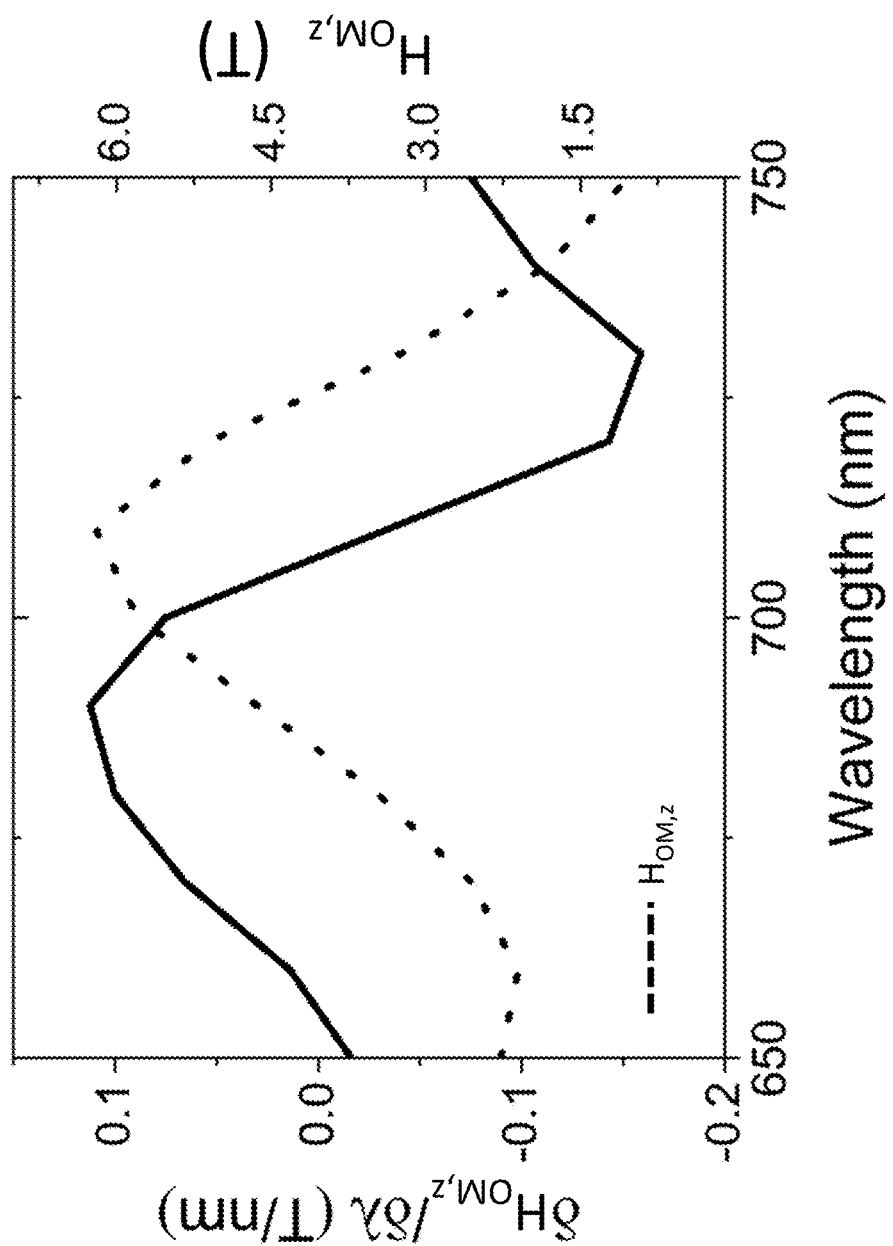
FIG. 12 is a graph of $\delta H_{OMz}/\delta\lambda$ measured in T/nm as well as $H_{OHz}$ in T vs. wavelength in nm for the magneto-plasmonic structure of FIG. 1, showing a maximum magnitude of $\delta H_{OMz}/\delta\lambda$ T/nm at a wavelength of about 730 nm.

Referring to FIG. 12, graph of $\delta H_{OM,z}/\delta\lambda$ measured in T/nm as well as $H_{OM,z}$ in T vs. wavelength in nm is provided for the magneto-plasmonic structure 103 of FIG. 1, showing a maximum $\delta H_{OH,z}/\delta\lambda$ T/nm at a wavelength of about 700 nm with BIG for nanomagnet 106. This is a parameter that can be used to distinguish the structure of the present disclosure from those of the prior art.

These results show that surface plasmon resonances can lead to significant near-field enhancement and thereby much higher opto-magnetic field $H_{OM}$ compared to free space excitation. In particular, the present disclosure sets out a showing that the magnitude of the plasmon-generated opto-magnetic field, $H_{OM}$, is enhanced in comparison to that resulting from the direct photon-magnetic material coupling to the tune of about 10 time the magnetic material that behaves as a dielectric at optical frequencies is coupled to a plasmonic resonator. The present disclosure also provides that the optical properties of the magnetic material play an important role in determining the strength of the plasmon resonance and hence an optimal choice of material is necessary in order to achieve the highest possible $H_{OM}$. The present disclosure also provides a roadmap of having in-plane components of the opto-magnetic field $H_{OM}$ associated with surface plasmon resonances. Thus, the proposed approach could potentially enable future on-chip plasmonic-magnetic devices for photonics, spintronics and hybrid devices.

Figure 13:
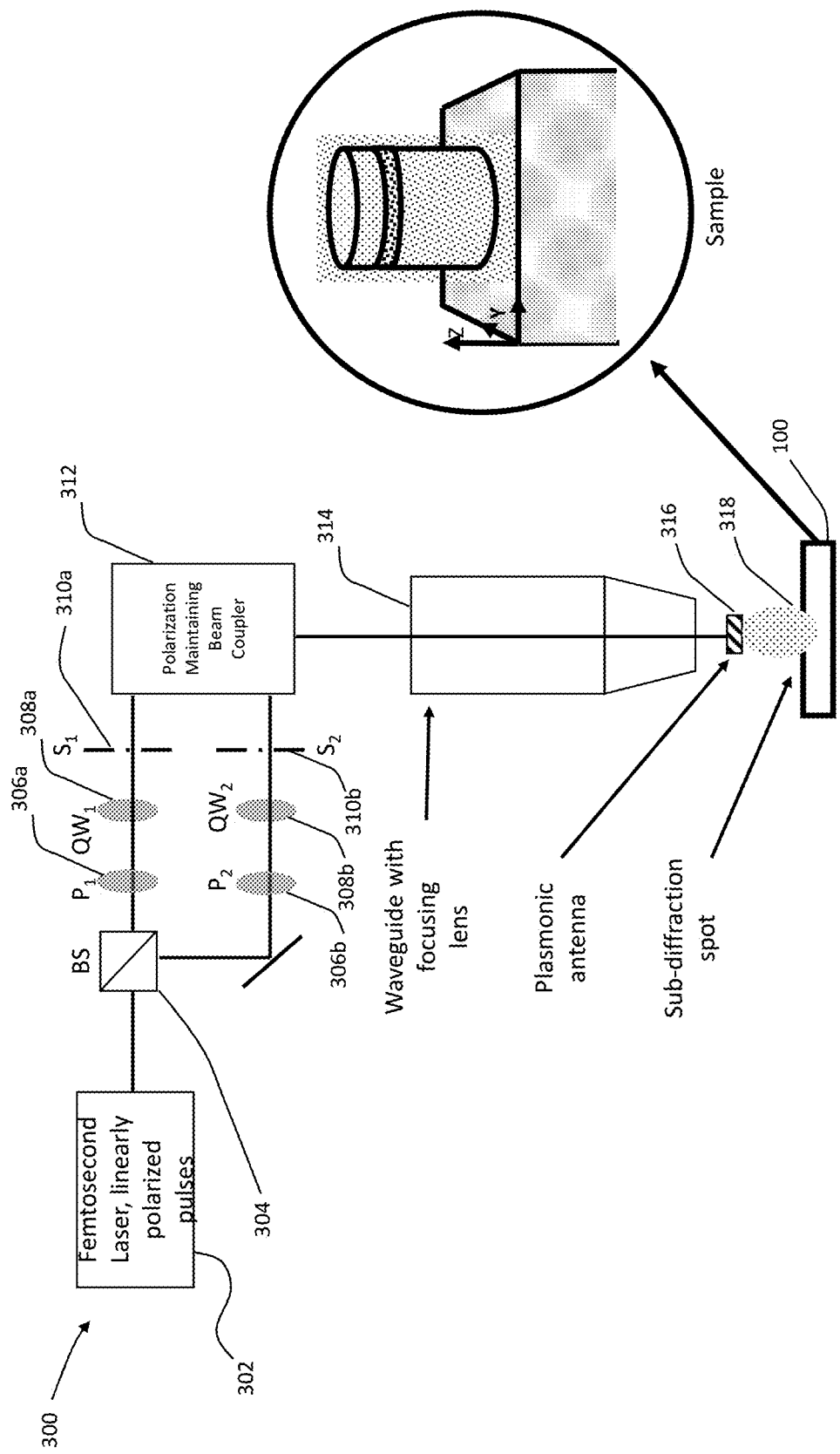
FIG. 13 is a schematic of a write circuit, employing the magneto-plasmonic structure of FIG. 1.

Referring to FIG. 13, a schematic of a write circuit 300, employing the magneto-plasmonic structure of FIG. 1, is provided. The write circuit 300 is driven by a femtosecond laser 302. The output of the laser passes through a beam splitter 304 (identified in the schematic as BS) which divides the laser output into two beams of equal power. Each split beam line has a polarizer 306a or 306b (identified in the schematic as P1 or P2) to further improve the degree of linear the beam polarization followed by a zero order air-gap quarter waveplate 308a or 308b (identified in the schematic as QW1 or QW2) and controlled by an electrically or optically controlled switch 310a or 310b (identified in the schematic as S1 or S2) that allows the user to select one or more laser pulses to be fed to a beam coupler 312. The zero order air-gap quarter waveplates 308a and 308b (identified in the schematic as QW1 and QW2) are configured to provide orthogonal circular polarizations (left or right) at their respective output. The output of the electrically or optically controlled switches 310a and 310b (identified in the schematic as S1 and S2) are fed into the polarization maintaining beam coupler 312. At any instant, at the output of the beam coupler 312, either of the pulse(s) through the electrically or optically controlled switches 310a or 310b (identified in the schematic as S1 or S2), whichever is on, will be present. These pulse(s) is(are) fed to a waveguide 314 with a plasmonic antenna 316 at a distal end to generate a sub-diffraction beam spot 318 to write on the magneto-plasmonic stack 103 (see FIG. 1).

Figure 14:
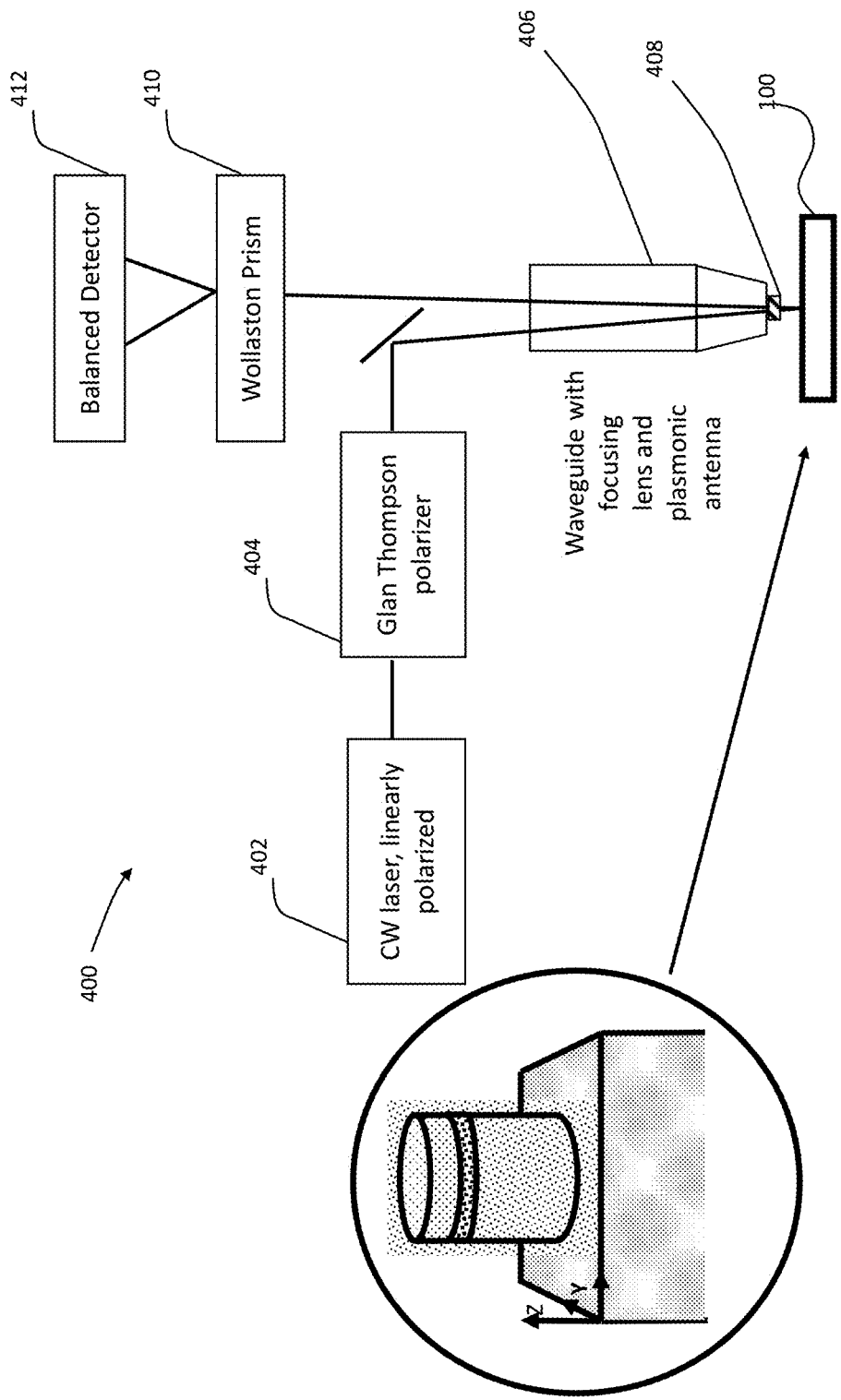
FIG. 14 is a schematic of read circuit, employing the magneto-plasmonic structure of FIG. 1.

Referring to FIG. 14, a read circuit 400 is shown. In this example, the read circuit 400 is driven by a continuous wave laser with linear polarization 402. It is understood by those skilled in the art that the read laser can also be a pulsed laser, and referring to the write circuit 300, the pulsed laser can be derived from the same fs laser of 302. A Glan-Thompson polarizer 404 further improves the degree of linear polarization of the incident beam. The output then passes through a similar waveguide 406 setup as in the read circuit 400 with lens and plasmonic antenna 408 to achieve sub-diffraction spot size (not shown). The reflected beam is again captured by the same waveguide and fed into a Wollaston prism 410 which splits the beam into two orthogonal components. These components are fed into a balanced photodetector 412 which provides an electrical output proportional to the difference in the intensities of the two orthogonal components. A positive/negative output corresponds to up/down (or down/up) orientation of the magnet in the magneto-plasmonic stack 103 (see FIG. 1).

The write circuit 300 performs the write operation as follows: Depending on the hellicity of the circularly polarized light (i.e., clockwise or counter-clockwise), the magnetization is switched from downward to upward. In particular, when one of the electrically or optically controlled switches 310a or 310b (identified in the schematic as S1 or S2) is activated to allow left or right circular pulses which when incident upon the magneto-plasmonic structure 100 (see FIG. 1) would toggle the magnetization. For example, if the electrically or optically controlled switch 310a (identified in the schematic as S1) is opened and the electrically or optically controlled switch 310b (identified in the schematic as S2) is closed, right circularly polarized light is incident on the sample and the magnetization at the magneto-plasmonic structure 100 (see FIG. 1) would be downward. To reverse the magnetization (or bit), if the electrically or optically controlled switch 310a (identified in the schematic as S1) is closed and the electrically or optically controlled switch 310b (identified in the schematic as S2) is opened to allow left circularly polarized pulses, then the magnetization at the magneto-plasmonic structure 100 (see FIG. 1) would be upward.

While, the write circuit 300 and the read circuit 400 are shown in specific implementations, other implementations are also possible. One key factor is to generate the needed circular polarizations to establish the rotational direction and thereby establish the bit within the structure of FIG. 1.

Those having ordinary skill in the art will recognize that numerous modifications can be made to the specific implementations described above. The implementations should not be limited to the particular limitations described. Other implementations may be possible.

The invention claimed is:

1. A system of writing to and reading from a magnetic nanostructure, comprising:
   an opto-magnetic write arrangement, comprising:
      a polarizer configured to receive incident light and provide a circularly or linearly polarized light, wherein light polarization is controlled by the polarizer and its orientation with respect to polarization of the incident light;
   a nanomagnetic structure configured to receive the polarized light, the magnetic nanostructure comprising:
      a substrate, and
      a nanomagnetic stack, comprising:
         a nanomagnet, and
         a capping layer,
         wherein the nanomagnetic stack is configured to receive the polarized light and thereby switch orientation of a magnetic moment associated with the magnetic nanostructure
         whereby the magnetic moment direction specifies a bit value held in the magnetic structure; and
   a magnetic read arrangement, configured to receive and interpret an optical signal from the magnetic nanostructure indicating the magnetic moment orientation from the nanomagnetic stack.

2. The system of claim 1, wherein the substrate is made of an optically transparent material dielectric.

3. The system of claim 2, wherein the optically transparent material is selected from the group consisting essentially of MgO and c-sapphire.

4. The system of claim 1, wherein the nanomagnet is one of a ferromagnet, a ferrimagnet or an antiferromagnet having magnetic perpendicular anisotropy.

5. The system of claim 4, wherein the nanomagnet selected from the group consisting essentially of Bi-substituted iron garnet (BIG) and Gadolinium Iron Cobalt (GdFeCo).

6. The system of claim 1, wherein the capping layer is $Si_3N_4$.

7. The system of claim 1, wherein diameter of the magnetic stack is between about 10 nm and 20 nm.

8. The system of claim 1, wherein the wavelength of the polarized light is between 660 nm and 740 nm.

\* \* \* \* \*